ETCH AND FILL

SAND, CLAD AND MASK

ETCH AND FILL

SAND

PARTIAL ETCH AND ADDITIONAL MASK

INVENTOR
LESTER H. HAZLETT

BY Cushman, Darby & Cushman
ATTORNEYS

COMPLETE ETCH, FILL AND SAND

COMPLETE ETCH, FILL AND SAND

PARTIAL ETCH AND ADDITIONAL MASK

INVENTOR
LESTER H. HAZLETT

BY Cushman, Darby & Cushman
ATTORNEYS

INVENTOR
LESTER H. HAZLETT

BY Cushman, Darby & Cushman
ATTORNEYS

United States Patent Office 3,405,227

Patented Oct. 8, 1968

3,405,227
MULTILAYER UNIVERSAL PRINTED CIRCUIT BOARD

Lester H. Hazlett, Scottsdale, Ariz., assignor to Control Data Corporation, Minneapolis, Minn., a corporation of Minnesota Filed Sept. 16, 1966, Ser. No. 580,104
8 Claims. (Cl. 174—68.5)

The present invention relates to a multilayer printed circuit board and, more particuuarly, to an improved multilayer board having standardized internal planes which permit a universal board to be utilized in a variety of applications.

In the electronics art, and particularly in the field of electronic data processing, equipment has become more and more compact due to the development of semiconductor technology and integrated circuits. Also, appreciable space-saving has been achieved in connector arrangements by utilizing improvements in printed circuitry.

A major contribution to the field of printed circuits has been the development of multilayer printed circuit boards. Such boards replace cumbersome wire harnesses and thereby save space and weight. As they can be accurately reproduced again and again, multilayer boards also permit high reliability. Such boards are also relatively easy to install and repair thereby contributing to economy and time saving.

Most multilayer printed circuit boards are designed for a special application. There have been attempts to design and build a standard, multi-use multilayer board. However, the resultant constructions are uneconomical and lack the flexibility necessary to render them commercially feasible.

It is therefore an object of the present invention to provide an improved multilayer printed circuit board which can be produced in volume at a low cost, and which offers flexibility of wiring between circuits and ease of modification, substitution or repair.

A further object of the invention is to provide a multilayer board which permits increased circuit density thereby permitting the board to be employed in high speed circuits.

Another object of the invention is to provide a reliable multilayer board which is universal in construction and which can be customized for a particular application by the addition of a single additional layer.

Ancillary to the foregoing, a still further object is to provide a universal multilayer board in which access to all signal lines is on a single board surface thereby making the signal paths easy to modify or repair.

Further objects and the entire scope of the invention will become more fully apparent when considered in the light of the following detailed description of an illustrative embodiment of this invention and from the appended claims.

Figure 10:
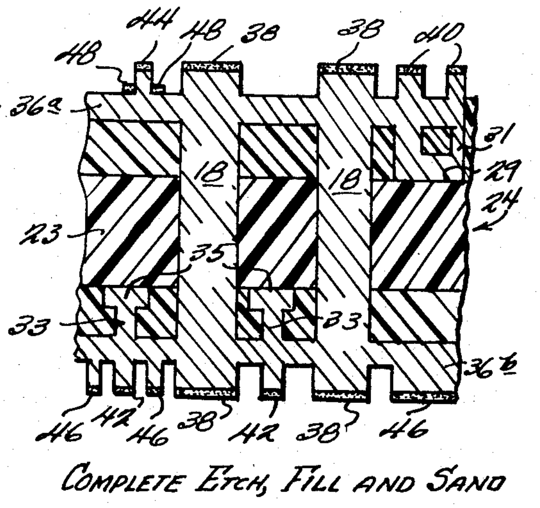
Figure 11:
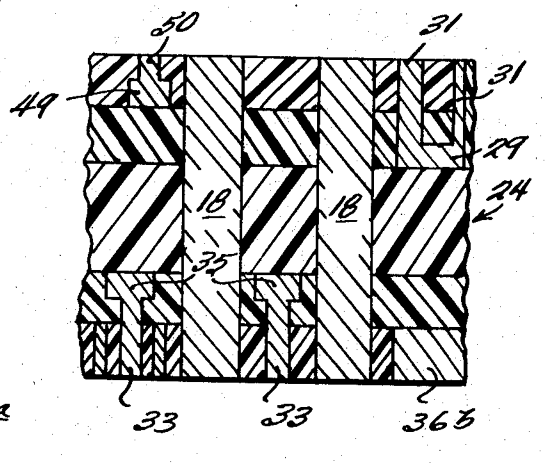
Figure 12:
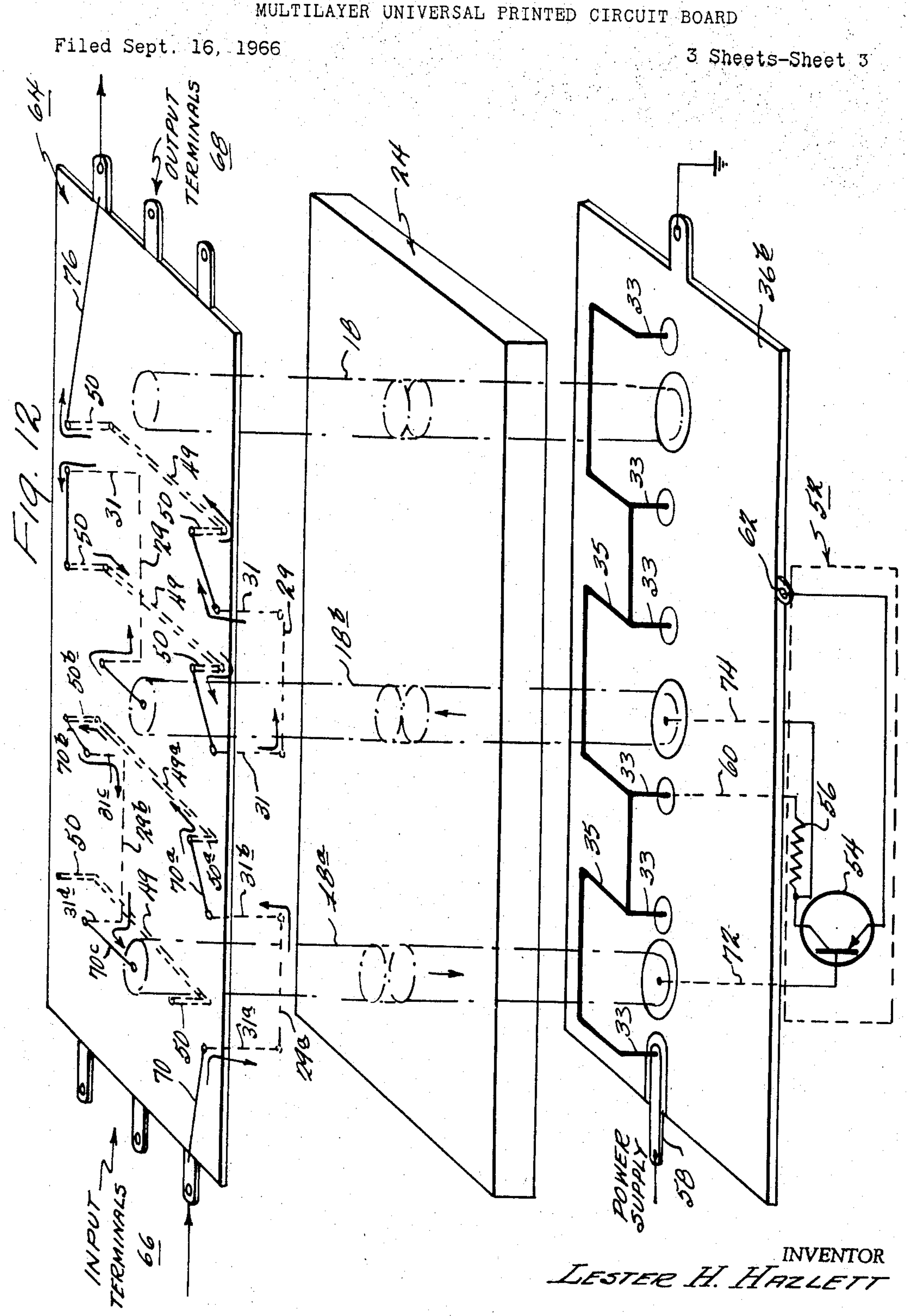

The illustrative embodiment may be best understood by reference to the accompanying drawings, wherein:

FIGURES 1 through 11 illustrate a method of fabricating a universal multilayer printed circuit board according to the invention; and FIGURE 12 is a schematic exploded view in perspective illustrating an arrangement for interconnecting the various layers of the multilayer board to operate a circuit component.

Briefly, the invention comprises a universal multilayer printed circuit board having a ground plane, a power plane and two signal planes. Each of the foregoing planes is separated from one another by a layer of electrical insulator material. The ground and power planes have conductive risers extending therefrom which are exposed at one surface of the universal board. The signal planes are characterized by lines of conductor segments parallel to one another in their respective planes, but orthogonally oriented with respect to the segments of the adjacent signal plane. The line segments are provided with a plurality of conductive risers, at ninety degrees with respect to the segments, which project through insulating material to the board surface opposite that on which the ground and power plane risers are exposed. Additional conductive posts extend completely through the board and are exposed at both major surfaces thereof. Circuit components are directly connected to the ground and power plane risers, and to the exposed portions of selected posts, on one side of the board. A customized printed circuit layer, or other conductive strip arrangement, is employed at the opposite side of the board to selectively interconnect the signal line segment risers and the posts passing through the entire board. In this manner, the signal paths are completed to the circuit components.

Referring now to FIGURES 1 through 11 of the drawings, the improved universal multilayer printed circuit board will be disclosed by a description of the method of its fabrication.

Figure 1:
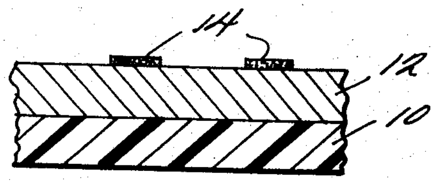

FIGURES 1 through 5 illustrate an arrangement for fabricating the central portion of the board. In FIGURE 1, a slab of epoxy filled with fiber-glass is designated as 10. This material is an electrical insulator and will hereinafter be referred to as a glass-epoxy. One surface of the slab 10 is coated with a sheet of copper 12. The exposed major surface of copper sheet 12 is selectively coated with an etch resistant masking material 14. The central portion of the printed circuit board is to be provided with conductive posts passing therethrough. Accordingly, the etch resistant mask portions 14 are applied in substantially circular patterns. The reason for this will become apparent as the description proceeds. The assembly shown in FIGURE 1 is then exposed to an etching solution which removes the unwanted conductive material in the unmasked areas.

Figure 2:
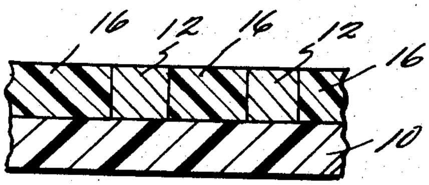
Figure 3:
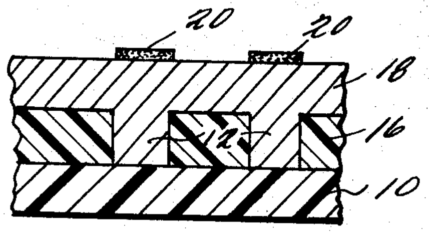

The masks 14 are then removed and the cavities formed during etching are filled with additional glass-epoxy 16, as illustrated in FIGURE 2. The top surface of the assembly shown in FIGURE 2 is sanded to make it smooth and to expose the tops of the conductors 12. The sanded surface is then clad with a sheet of copper such that the prior copper portions 12 are fused to this sheet to form a new copper portion indicated as 18 in FIGURE 3.

An etch resistant masking 20 is then applied to the exposed surface of the copper in alignment with the portions 12 remaining from the first etching step. Again, the masks 20 are formed in substantially circular patterns. The assembly shown in FIGURE 3 is again exposed to an etching solution, following which the masks 20 are removed and the cavities created by etching are filled with the glass-epoxy. This additional filling is indicated as 22 in FIGURE 4.

Figure 4:
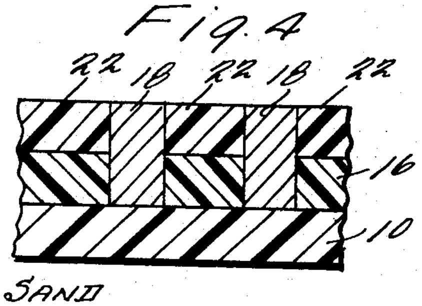
Figure 5:
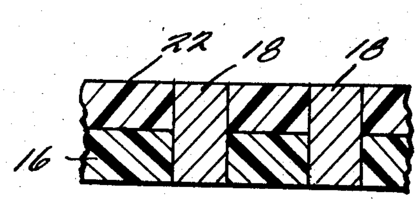

The top and bottom surfaces of the assembly of FIGURE 4 are then exposed to a sanding operation such that the glass-epoxy base 10 is removed and the posts 18 are exposed at the top and bottom surfaces of the completed central portion illustrated in FIGURE 5. This assembly comprises a relatively thick slab of insulating material 16, 22 having posts 18 projecting therethrough.

It is apparent that other arrangements could be employed to fabricate the central portion of the multilayer printed circuit board. For example, a relatively thick sheet of glass-epoxy could be drilled and the copper posts provided by means of a "plating-through" process. However, it has been found that a better product can be produced by utilizing the etching arrangement disclosed in detail in this illustration of a preferred embodiment of the invention.

Figure 6:
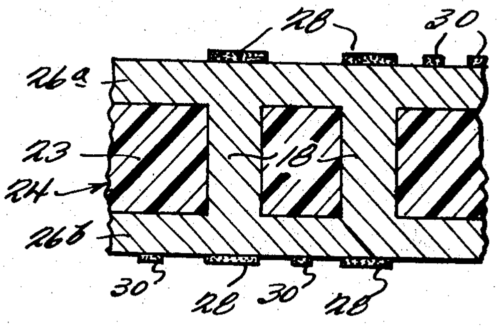

Before proceeding with the description of the remainder of the board, it should be appreciated that in FIGURE 6 of the drawings, now to be considered, the glass-epoxy portions 16 and 22 are conveniently indicated as an integral mass 23. The central portion as an entity will hereinafter be designated as 24.

With the central portion of the printed circuit board completed, the arrangement for fabricating the remainder of the board will be described with reference to FIGURES 6 through 11. In preparing the remainder of the multilayer board, the construction proceeds simultaneously on both major surfaces of the central portion 24. More particularly, the central portion has applied thereto sheets of copper 26*a* and 26*b*. The exposed surfaces of the copper sheets are selectively masked by an etch resistant material in prescribed patterns. In the multilayer board it is desired that the posts 18 pass all the way through the completed universal board. Consequently, masking 28 is provided in circular patterns in alignment with the posts 18. The remaining masking is in the form of small circular patterns 30 which are utilized to develop riser portions for the various conductive layers of the multilayer board. These risers will become more apparent as the description proceeds.

Figure 7:
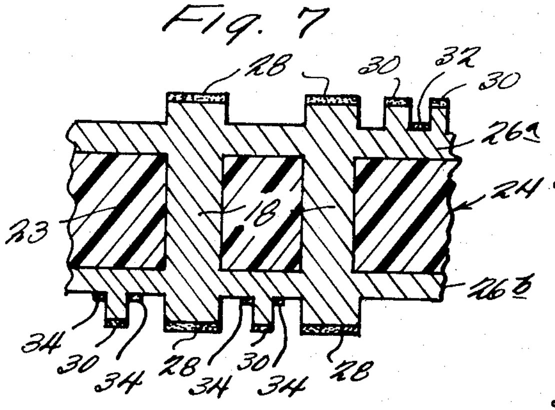

The assembly shown in FIGURE 6 is then exposed to a partial etching by which a portion of the unmasked copper is removed. This can be best appreciated by considering FIGURE 7. The exposed surface of the partially etched conductive copper sheet 26*a* is then selectively masked in patterns forming line segments substantially parallel to one another and to the plane of the paper. For drawing convenience only, one such additional masking is shown in FIGURE 7, this being designated as 32. The masking 32 serves to provide signal line segments, as will hereinafter be described in greater detail. It should be noted that the masking 32 extends to the riser portions under masking 30 on copper sheet 26*a*, which portions were developed during the partial etching. The exposed surface of the other copper sheet 26*b* is also additionally masked by etch resistant material 34. Again, this additional masking 34 extends to the riser portions developed during the partial etching of sheet 26*b*. The masking 34 preferably comprises a single strip so as to interconnect all of the risers projecting from copper sheet 26*b*. The purpose of this interconnection is that the conductive path to be formed by a subsequent etching of surface 26*b* is intended to serve as the power plane within the multilayer printed circuit board. Thus, by interconnecting the risers from sheet 26*b* by a conductive strip, power can be made available to each of the risers in contact therewith.

Figure 8:
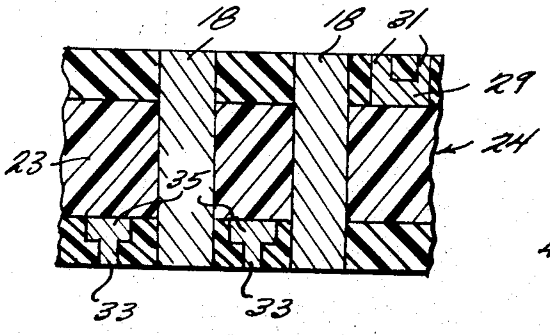

The assembly illustrated in FIGURE 7 is then exposed to additional etching whereby the remaining exposed portions of copper sheets 26*a* and 26*b* are removed. The masking is then withdrawn and cavities are filled with glass-epoxy. Subsequently, the exposed major surfaces are sanded so that the tops of the posts 18 and risers 31 and 33 are exposed. The resultant assembly is illustrated in FIGURE 8 of the drawings wherein the signal layer or plane, having a line segment 29, is shown in communication with the exposed top surface of the assembly by means of the conductive risers 31. The power plane 35 is in communication with the exposed bottom surface of the assembly by means of the plurality of risers 33.

Additional layers of the multilayer board are developed in a manner similar to the process described with reference to FIGURES 6 through 8. More particularly, the assembly shown in FIGURE 8 is clad on its opposite major surfaces by copper sheets 36*a* and 36*b*. Again, the exposed surfaces of sheets 36*a* and 36*b* are covered with an etch resistant masking 38 formed in circular patterns in alignment with the posts 18. Additional masking 40 is applied to the exposed surface of sheet 36*a* in small circular patterns in alignment with the risers 31. On the exposed surface of sheet 36*b* further maskings 42, having a pattern corresponding to the configuration of the risers 33, are applied in alignment with these risers. As is apparent from the preceding description, the masks 38, 40 and 42 are designed to insure that the respective posts and risers will project through the board to the exposed surfaces of the multilayer construction.

Figure 9:
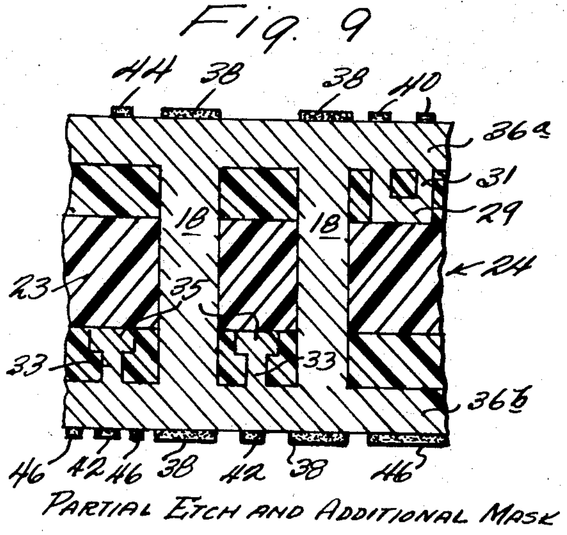

Still further masking is employed to develop additional layers on the board. To the exposed surface of copper sheet 36*a*, small circular patterns 44 are applied to develop new risers. For convenience of illustration, only one such masked area 44 is shown. With respect to the copper sheet 36*b*, this conductor is intended to be used as the exposed ground plane for the multilayer printed circuit board. It is also desirable that this conductor be used as a heat sink. Consequently, it is intended that as much copper as possible remain after the etching operation. Therefore, the major portion of the exposed surface of sheet 36*b* is covered with etch resistant masking 46. It is important, however, that the posts 18 and the risers 33 extend to the bottom of the printed circuit board and be electrically insulated from the ground plane. Therefore, the masking material 46 is patterned in such a manner that it avoids extending to and contacting masking 38 and 42. The resultant assembly, illustrated in FIGURE 9, is then exposed to a partial etching process. The results of this partial etch are illustrated in FIGURE 10. As can be seen, portions of surfaces 36*a* and 35*b* which were not masked have been removed.

A second signal layer or plane is developed by providing additional masking 48 on the exposed surface of sheet 36*a*. The masking 48 is in a pattern of parallel line segments extending orthogonally with respect to the line segments 29. The masking 48 extends to the riser portions under masking 44, which portions were developed during the prior partial etching. Consequently, when the etch is completed in the operation which will be described hereinafter, the line segments defined by the masking 48 will be in conductive contact with the risers defined by masking 44 thereby electrically connecting the line segments to the upper surface of the multilayer printed circuit board.

It is apparent from FIGURE 9 of the drawings, and from the prior description, that the line segments 29 extend parallel to the plane of the paper. Thus, it is easily appreciated that the line segments 29 have a plurality of risers 31 extending upwardly from each line segment at spaced intervals therealong. However, it should be pointed out that the line segments defined by the masking 48 extend normal to the plane of the paper and also have a plurality of spaced risers associated with each line segment. For convenience, only one such segment is illustrated. The orthogonal arrangement of the line segments serves the purpose of eliminating electromagnetic coupling in the finished board.

Now that these points have been made, the description of the fabrication process will proceed. The assembly of FIGURE 10 is subjected to a completion of the etching process following which all of the masking is removed, the cavities filled by the glass-epoxy, and the major surfaces sanded so as to expose the various risers and posts.

The resultant universal multilayer printed circuit board is illustrated in FIGURE 11 of the drawings. As can be seen in this figure, the signal line segments 29 are in electrical communication with the upper surface of the board by means of the exposed risers 31 which are insulated from one another by the glass-epoxy. Similarly, the line segments 49, which are orthogonally oriented with respect to segments 29 and are insulated therefrom in a parallel plane, are conductively connected to the upper surface of the board by means of risers 50 which are also insulated from one another. The posts 18 extend completely through the universal multilayer printed circuit board and are exposed at both ends. The risers 31 and 50, and the posts 18, are electrically insulated from one another by the glass-epoxy which lies above the central portion 24 of the printed circuit board. The power plane conductor 35 is conductively connected to the bottom surface of the circuit board by means of a plurality of risers 33. These risers 33, posts 18 and the ground plane formed by conductive sheet 36*b* are electrically insulated from one another by the glass-epoxy which lies below the central portion 24 of the complete assembly. Of course, the ground and power planes are in spaced parallel planes and are insulated with respect to each other. The central epoxy portion 24 of the universal board is relatively wide with respect to the separation between the signal layers so that the relative impedance between the ground layer and each signal layer is substantially equal.

The foregoing description is that of a preferred embodiment of fabricating a universal multilayer printed circuit board. Such a board is highly compatible for use with integrated circuitry, particularly in high speed applications such as computers. An arrangement for employing the universal multilayer circuit board, with an integrated circuit component will be described with reference to FIGURE 12. This figure is an exploded view in perspective which illustrates in an expanded fashion the various portions of the board described with reference to FIGURES 1 through11.

For purposes of illustration, the various portions of the universal circuit board have been shown schematically in FIGURE 12 so that the principles of operation and utility of this universal board can be fully appreciated. The problem which will be solved by the illustration of FIGURE 12 is the use of the universal board in conjunction with a simplified integrated circuit to amplify an input signal. The integrated circuit is diagrammatically represented within a box designated as 52. The integrated circuit in this illustration comprises a conventional PNP-type transistor 54 having a dropping resistor 56 tied to its collector. Of course, the integrated circuit is assumed to have external terminals by which connections may be made from the exterior of the circuit to the components therein.

In the illustrative embodiment, a supply voltage is connected to the conductive strip 35 which comprises the power plane of the multilayer board. This power supply is connected by means of a suitable terminal 58 on the bottom on the board, and insulated from the ground plane, to one of the risers 33 extending from the bottom surface of the universal board to the power plane conductor 35. Since conductor 35 comprises a single electrical path, it is apparent that the power supply is available at all of the risers 33. In the illustrative embodiment, the exposed surface of one of the risers 33 is connected to a terminal 60 of the integrated circuit 52 so as to supply bias through resistor 56 to the collector of transistor 54. The emitter of the transistor 54 is joined by he terminal 62 to the ground plane 36*b* of the universal circuit board. FIGURE 12 illustrates that the conductive sheet 36*b* which forms the ground plane is connected through suitable terminal means to ground.

With the integrated circuit suitably biased, it is now necessary to describe the arrangement by which the signal to be amplified is applied to the integrated circuit and the amplified output therefrom is transferred. This is accomplished by means of a custom printed circuit layer 64 which is applied to the top surface of the universal board. The printed circuit has input terminals 66 and output terminals 68. On the custom board, conductive paths are printed which selectively interconnect the input and output terminals via the posts 18 and risers 31 and 50 from the universal board. Representative of such an arrangement is the pattern which is shown in FIGURE 12. This rather complex arrangement has been adopted to illustrate how a signal can be carried from plane to plane. For illustrative purposes, the printed circuitry of the custom board 64 is illustrated in solid lines. The signal line segments 29 and their associated risers 31 are shown as single dash lines. The signal line segments 49 which are orthogonally oriented with respect to segments 29 are designated by double dash lines, as are their associated risers 50.

The signal to be amplified in the present illustration is applied to one of the input terminals 66 and is carried by the printed circuit portion 70 to the exposed surface of a first riser 31*a*. This riser carries the signal below the surface of the universal board to the plane of line segment 29*a*. At the end of this segment, the signal is returned to the surface of the universal board by riser 31*b* to be carried by printed circuit segment 70*a* to the exposed portion of riser 50*a*. This riser directs the signal below the surface of the universal board to the line segment 49*a* in the other signal plane. The signal then is carried by riser 50*b* to the board surface to be directed by printed circuit segment 70*b* to riser 31*c*, along line segment 29*b*, up 31*d* to printed circuit element 70*c*, which carries the signal to post 18*a*. This post then carries the signal through the entire universal board to terminal 72 which couples the input signal to the base of the transistor 54. The output of the transistor is connected by terminal 74 to the bottom of post 18*b* which carries the signal again to the top of the universal board. The signal again passes through an interconnected arrangement of the line segments of the two signal planes and the custom printed circuit segments, as illustrated by the directional arrows, to a final segment 76 which is joined to one of the output terminals 68.

The example presented in FIGURE 12 is illustrative of one of any number of possible paths for coupling an input through the universal board to an integrated circuit and then for directing the output of said circuit to an output terminal. Of course, it is contemplated that the signals might pass through a number of interconnected circuits before being delivered to an output terminal.

The illustrated embodiment is an extremely simplified presentation of the basic elements defining a universal printed circuit board according to the invention. In practice, a much more elaborate board would be fabricated having a great number of line segments, posts and risers. The precise configuration of such a board would necessarily be a function of the masking patterns by which the signal line segments, power plane and ground plane are developed. It is obvious that an infinite number of combinations are possible.

The universal multilayer printed circuit board disclosed is adaptable to repair, modification or re-use. To change a connection all that is necessary is to sever appropriate segments of the custom printed circuit layer and solder new conductive segments between the desired points on the universal board. Also the universal board can be re-used by grinding off the entire custom layer of printed circuitry and applying a new custom layer to the board.

Of course, it is not necessary that the custom layer be printed circuitry. If desired, the various risers and posts on the upper surface of the universal board could be interconnected by conventional conductive segments.

All that is necessary to adapt a universal multilayer printed circuit board to a particular environment is the addition of a single custom layer on the surface of the universal board adjacent the signal planes. Since identical boards can be used for any number of applications, they can be produced at high volume, thereby effecting an economy advantage. The fact that only two layers or planes are required for signal line segments also contributes to the economy of the board.

The ability to selectively patch together line segments permits short conducting paths to be completed to interconnect various elements. This feature permits the universal board to be useful in high speed applications where high density circuit arrangements and signal line impedance are important factors in determining speed capability.

The use of an exposed ground plane, which consists of a relatively large metal surface, provides a further advantage in dissipating heat from the board.

The above described embodiment is illustrative of a preferred embodiment of the invention but is not intended to limit the possibilities of insuring the features of high volume productivity, high speed capability, and ease of substitution, repair or modification. The universal multilayer printed circuit board designed as disclosed herein is an example of an arrangement in which the inventive features of this disclosure may be utilized, and it will become apparent to one skilled in the art that certain modifications may be made within the spirit of the invention as defined by the appended claims.

What is claimed is:

1. A multilayer printed circuit board comprising: a plurality of electrical conductor segments arranged in spaced planes, at least one conductive strip and a further conductor spaced from each other and from the segment planes, electrical insulator material embedding said conductive strip and the conductor segments and separating the further conductor, the conductor segment planes and the conductive strip; a plurality of conductive risers connected to the individual conductor segments and projecting through said insulator material to thereby expose portions of the risers, said risers being electrically insulated from the risers connected to other conductor segments, from the conductive strip, and from the further conductor; at least one additional conductive riser connected to said strip and projecting through said insulator material to thereby expose a portion of said riser, the additional riser being electrically insulated from the conductor segment risers and from the further conductor; and a plurality of conductive posts embedded within said insulator material and projecting therethrough to thereby expose portions of the posts on opposite sides of the printed circuit board, the insulator material electrically insulating said posts from the further conductor, the conductor segments, the conductive risers and strip, and each other.

2. A multilayer printed circuit board as set forth in chaim 1, wherein said conductor segments lie in two substantially parallel planes, the segments within each plane being positioned parallel to one another and at an angle with respect to the segments in the other plane.

3. A multilayer printed circuit board as set forth in claim 2, wherein the segments in one plane are orthogonally oriented with respect to the segments in the other plane.

4. A multilayer printed circuit board as set forth in claim 1, wherein the further conductor is exposed to additionally serve as a heat sink for said circuit.

5. A multilayer printed circuit board comprising: a slab of electrical insulator material, a plurality of electrical signal conductor segments arranged in spaced planes adjacent one major surface of said slab, additional electrical insulator material surrounding said segments and separating the planes, a plurality of conductive risers connected to individual signal conductor segments and projecting through said additional insulator material to thereby expose portions of the risers, said risers being electrically insulated from the risers connected to other signal conductor segments; at least one conductive strip positioned adjacent the second major surface of said slab and a further conductor spaced by an insulator from said strip on the opposite side of said strip from said slab, at least one additional conductive riser connected to said strip and projecting through the insulator separating the strip and the further conductor to thereby expose a portion of the additional riser, said additional riser being electrically insulated from the further conductor; and a plurality of conductive posts passing through said slab and projecting through the other insulator materials to thereby expose portions of the posts on opposite sides of the printed circuit board, the insulator materials electrically insulating said posts from the signal conductor segments, the further conductor, the conductive risers and strip, and each other.

6. A multilayer printed circuit board as set forth in claim 5, wherein said signal conductor segments lie in two planes, the segments within each plane being positioned parallel to one another and at an angle with respect to the segments in the other plane.

7. A multilayer printed circuit board as set forth in claim 6, wherein the segments in one plane are orthogonally oriented with respect to the segments in the other plane.

8. A multilayer printed circuit board as set forth in claim 5, wherein the further conductor is exposed to additionally serve as a heat sink for said circuit.

No references cited.

DARRELL L. CLAY, *Primary Examiner.*